United States Patent
Cunningham et al.

(10) Patent No.: US 9,111,629 B2
(45) Date of Patent: Aug. 18, 2015

(54) SMART CHARGE PUMP CONFIGURATION FOR NON-VOLATILE MEMORIES

(75) Inventors: Jeffrey C. Cunningham, Austin, TX (US); Karthik Ramanan, Austin, TX (US); Ross S. Scouller, Austin, TX (US); Ronald J. Syzdek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 396 days.

(21) Appl. No.: 13/441,335

(22) Filed: Apr. 6, 2012

(65) Prior Publication Data

US 2013/0265828 A1 Oct. 10, 2013

(51) Int. Cl.
*G11C 16/04* (2006.01)
*G11C 16/30* (2006.01)
*G11C 5/14* (2006.01)
*G11C 8/08* (2006.01)
*G11C 16/34* (2006.01)

(52) U.S. Cl.
CPC ............... *G11C 16/30* (2013.01); *G11C 5/145* (2013.01); *G11C 8/08* (2013.01); *G11C 16/3454* (2013.01)

(58) Field of Classification Search
CPC ........ G11C 16/10; G11C 16/12; G11C 16/24; G11C 16/26; G11C 16/3418; G11C 16/0483; G11C 11/5628; G11C 19/28; G11C 19/282; G11C 27/04
USPC ................... 365/183, 189.07, 185.19, 185.25
See application file for complete search history.

(56) References Cited

U.S. PATENT DOCUMENTS

| | | | |
|---|---|---|---|
| 5,414,669 A | 5/1995 | Tedrow et al. | |
| 5,430,674 A | 7/1995 | Javanifard | |
| 5,537,350 A * | 7/1996 | Larsen et al. | 365/185.33 |
| 5,907,700 A | 5/1999 | Talreja et al. | |
| 6,597,605 B2 | 7/2003 | Kreifels et al. | |
| 6,642,774 B1 | 11/2003 | Li | |
| 6,747,853 B2 | 6/2004 | Hayashi et al. | |
| 6,747,893 B2 | 6/2004 | Uribe et al. | |
| 6,803,630 B2 | 10/2004 | Pio et al. | |
| 7,054,193 B1 * | 5/2006 | Wong | 365/185.03 |
| 7,233,528 B2 | 6/2007 | Chan et al. | |
| 7,279,959 B1 | 10/2007 | Choy | |
| 7,292,473 B2 | 11/2007 | Niset et al. | |
| 7,355,894 B2 | 4/2008 | Pekny et al. | |
| 7,397,703 B2 | 7/2008 | Niset et al. | |
| 7,830,719 B2 | 11/2010 | Leutgeb et al. | |
| 7,902,915 B2 | 3/2011 | Pelley | |
| 7,925,820 B2 | 4/2011 | Im | |

\* cited by examiner

Primary Examiner — Tha-O H Bui

(57) ABSTRACT

A semiconductor memory device includes a non-volatile memory, a memory controller, and a charge pump system. The memory controller establishes first parameters for a first programming cycle of a first plurality of memory cells of the non-volatile memory prior to the first programming cycle being performed. The charge pump system includes a plurality of charge pumps and provides a first programming pulse for use in performing the first program cycle. The first programming pulse is provided by selecting, according to the first parameters, which of the plurality of charge pumps are to be enabled during the first program cycle and which are to be disabled during the first program cycle.

17 Claims, 7 Drawing Sheets

SMART CHARGE PUMP CONFIGURATION FOR NON-VOLATILE MEMORIES

BACKGROUND

1. Field

This disclosure relates generally to semiconductor processing systems, and more specifically, to dynamically reconfiguring charge pumps between non-volatile memory (NVM) programming pulses.

2. Related Art

Ongoing development of Non-Volatile Memory (NVM) bitcells requires "smart" medium and high voltage generation techniques in order to meet cycling and data retention targets. The "smart" pulses usually require: controlled ramp rates, and programmable supply levels, duration and recovery. There is further an ever-increasing need to program more bitcells in parallel to speed NVM testing and to better control program pulses by reducing overshoot, ripple and maintaining "smart" pulse integrity through cycling. It is also desired to reduce power and area consumption by using a smaller stability capacitor, which needs to be charged during programming to help reduce ripple.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods are disclosed that provide the ability to compute the number of non-volatile memory (NVM) bitcells to be programmed after each programming pulse, and to configure the output impedence of a medium voltage charge pump to match the current load from the bitcells to save power, tighten programming levels, minimize stabilizing capacitance, and enable efficient operation. Notably, the pumping strength of the charge pump is configured prior to each program pulse by enabling/disabling charge pump cells and adjusting pump capacitor values in medium and high voltage charge pumps.

Figure 1:
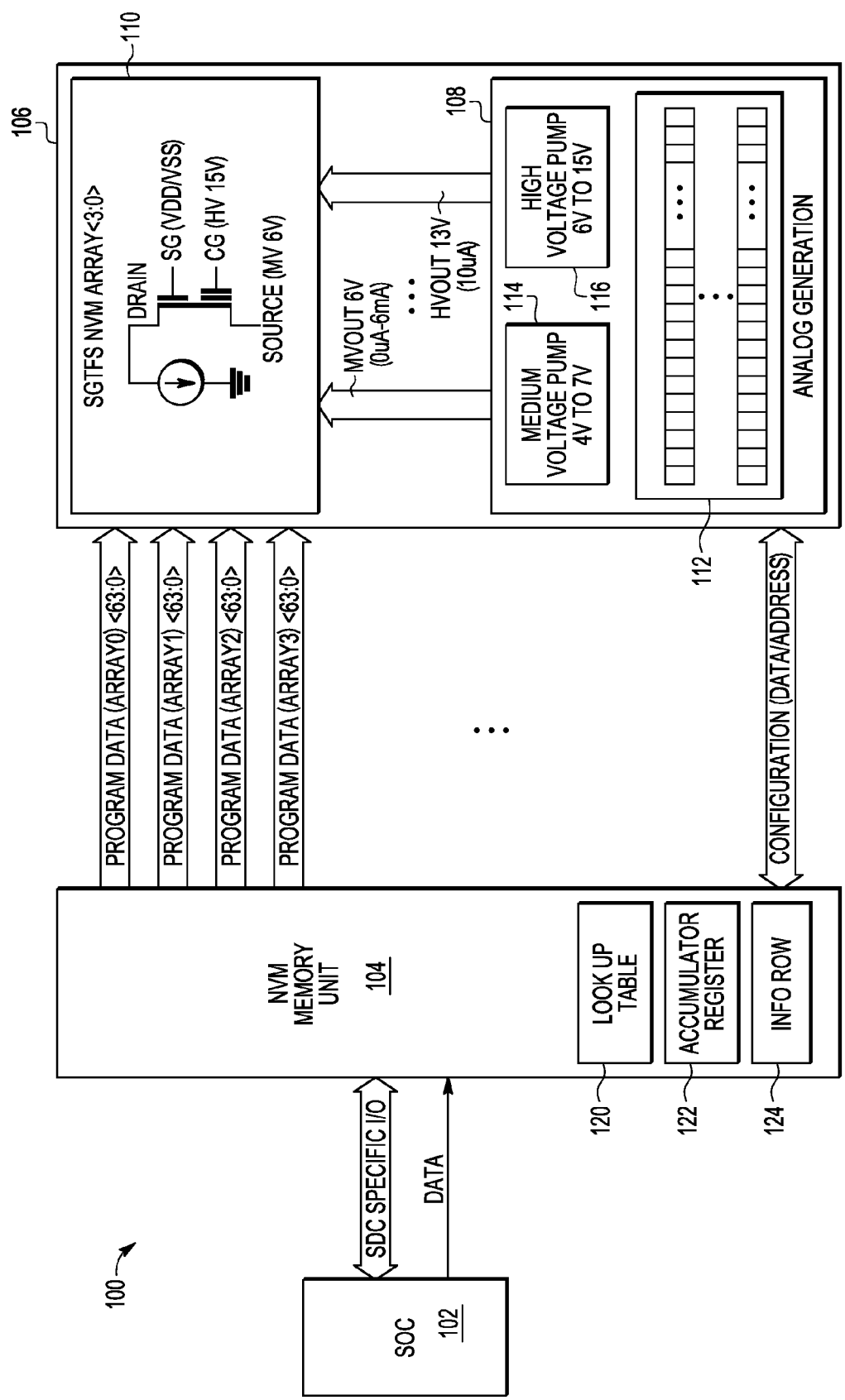
FIG. 1 is a block diagram of a processing system in accordance with an embodiment of the invention.

FIG. 1 is a block diagram of a processing system 100 incorporating a non-volatile semiconductor memory device in accordance with an embodiment of the invention. Components in process system 100 include system-on-chip (SOC) 102, NVM memory unit 104, and NVM hardblock 106. SOC 102 can be a system-on-a-chip or other suitable data processor. SOC 102 can have any number of processing cores, cache memory units, memory management units, random access memory, signal processing components, and other suitable components. An example of a SOC 102 that can be used in system 100 is the Kinetis microcontroller commercially available from Freescale Semiconductor, Inc. of Austin, Tex.

NVM memory unit 104 acts as an interface between SOC 102 and hardblock 106 by converting information from SOC 102 for use by hardblock 106 and vice versa. NVM memory unit 104 can be used for a variety of purposes including program code storage, storage for data tables and/or for byte write/erase system data.

Hardblock 106 can include an analog generation unit or charge pump system 108 that provides one or more levels of voltage to program and erase bitcells in memory array 110. Memory array 110 can be any suitable type of non-volatile memory such as flash memory. In some embodiments, memory array 110 includes split gate bitcells with nanocrystal storage elements, such as the Thin Film Storage (TFS) memory array commercially available from Freescale Semiconductor, Inc. of Austin, Tex.

Analog generation unit 108 can include calibration and trim data registers 112, medium voltage pump 114 and high voltage pump 116. Calibration and trim data registers 112 can store charge pump configuration information supplied by NVM memory unit 104. The output of medium voltage pump 114 is provided to the select gate of the bitcells in memory array 110 and the output of high voltage pump 116 is provided to the control gate of the bitcells in memory array 110.

Figure 2:
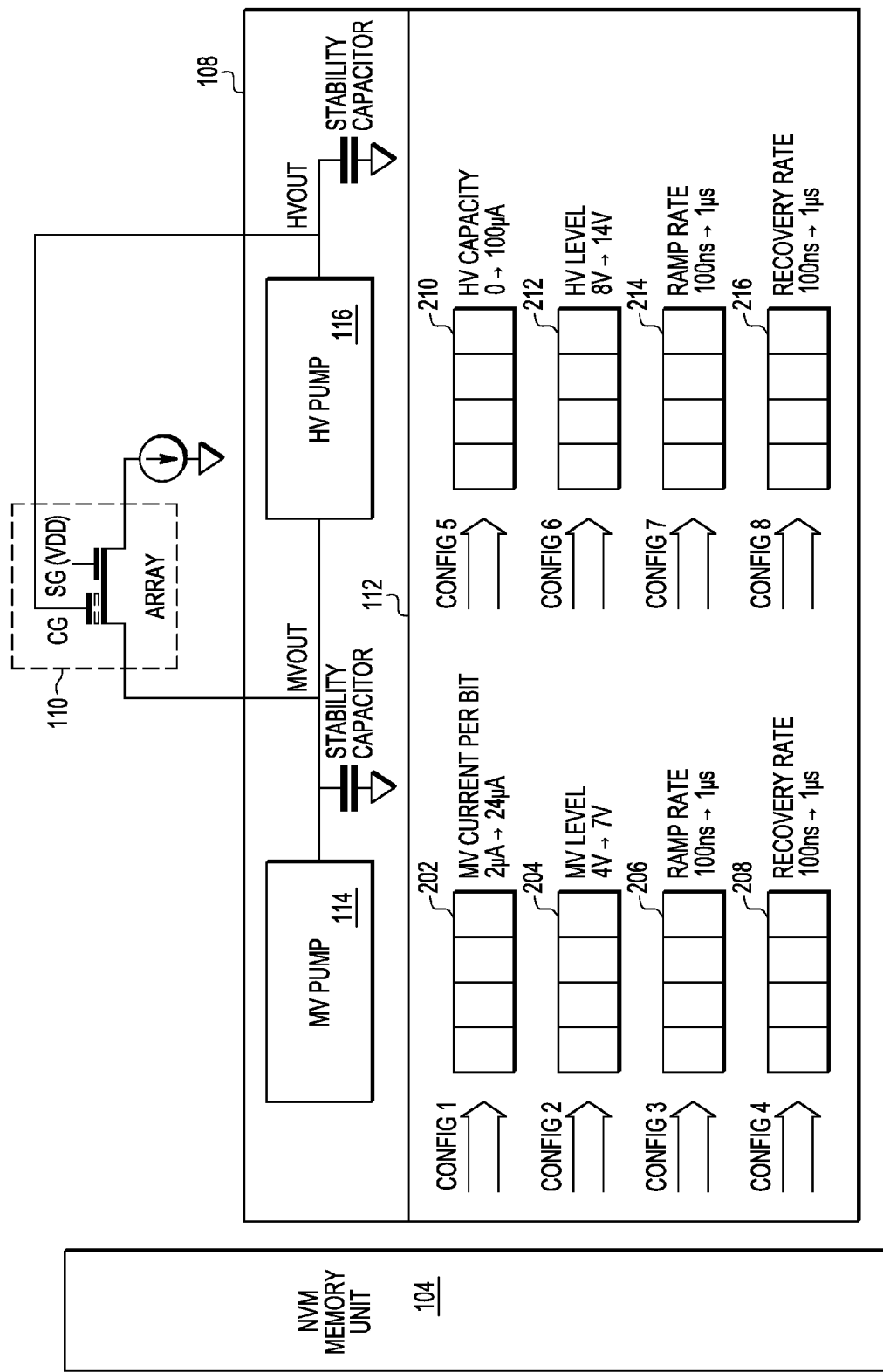
FIG. 2 is a block diagram of an embodiment of an analog generation unit that can be used in the processing system of FIG. 1.

Referring to FIG. 2, a block diagram of an embodiment of analog generation unit 108 is shown including four calibration and trim data registers 202-208 for medium voltage charge pump 114 and another four calibration and trim data registers 210-216 for high voltage charge pump 116. Register 202 can be referred to as configuration register 1 and can be used to store the current per bit desired to be supplied from the medium charge pump 114 to memory array 110. In some embodiments, the current can range from 2 to 24 microAmps, however other suitable current values can be used.

Register 204 can be referred to as configuration register 2 and can be used to store one or more values of voltage to be supplied by medium charge pump 114. When configuration register 2 is used to store more than one value, the number of bits available in the register 204 can be split to hold respective values. For example, when configuration register 2 has 4 bits, configuration register 2(*a*) can hold one value (e.g., 6 Volts) in bits 0:1 and configuration register 2(*b*) can hold another value (e.g., 6.5 Volts) in bits 2:3. Other suitable voltage values and number of voltage values can be used.

Register 206 can be referred to as configuration register 3 and can be used to store one or more values of a ramp rate for the voltage to be supplied by medium charge pump 114. When configuration register 3 is used to store more than one ramp rate value, the number of bits available in the register 206 can be split to hold respective values. For example, when configuration register 2 has 4 bits, configuration register 3(*a*) can hold one value (e.g., ramp in the voltage in configuration register 2(*a*) over 100 ns) in bits 0:1, and configuration register 3(*b*) can hold another value (e.g., ramp in the voltage in configuration register 2(*b*) over 1.6 microseconds) in bits 2:3. Other suitable ramp rate values and number of voltage ramp rate values can be used.

Register 208 can be referred to as configuration register 4 and can be used to store a recovery rate for medium charge pump 114. The recovery rate refers to the amount of time required from the voltage of medium charge pump 114 to return from a peak value to an idle or nominal value. In some embodiments, the recovery rate can range from 100 nanoseconds to 1.6 microseconds, however other suitable recovery rate values can be used.

Register 210 can be referred to as configuration register 5 and can be used to store bitcell leakage compensation current desired to be supplied from the high charge pump 116 to memory array 110. In some embodiments, the compensation current can range from 1 to 100 microAmps, however other suitable current values can be used.

Register 212 can be referred to as configuration register 6 and can be used to store one or more values of voltage to be supplied by high charge pump 116. When configuration register 6 is used to store more than one value, the number of bits available in the register 212 can be split to hold respective values. For example, when configuration register 6 has 4 bits, configuration register 6(*a*) can hold one value (e.g., 8.75 Volts) in bits 0:1 and configuration register 6(*b*) can hold another value (e.g., 9.25 Volts) in bits 2:3. Other suitable voltage values and number of voltage values can be used.

Register 214 can be referred to as configuration register 7 and can be used to store one or more values of a ramp rate for the voltage to be supplied by high charge pump 116. When configuration register 7 is used to store more than one ramp rate value, the number of bits available in the register 214 can be split to hold respective values. For example, when configuration register 6 has 4 bits, configuration register 7(*a*) can hold one value (e.g., ramp in the voltage in configuration register 2(*a*) over 100 nanoseconds) in bits 0:1, and configuration register 7(*b*) can hold another value (e.g., ramp in the voltage in configuration register 2(*b*) over 1.6 microseconds) in bits 2:3. Other suitable ramp rate values and number of voltage ramp rate values can be used.

Register 216 can be referred to as configuration register 8 and can be used to store a recovery rate for high charge pump 116. The recovery rate refers to the amount of time required from the voltage of high charge pump 116 to return from a peak value to an idle or nominal value. In some embodiments, the recovery rate can range from 100 nanoseconds to 1.6 microseconds, however other suitable recovery rate values can be used.

Note that analog generation unit 108 can include any suitable number and width (i.e., number of bits per register) of calibration and trim data registers 112, with the configuration registers 112 of FIG. 2 being just one example. Further, other values and ranges of values may be stored in configuration registers 112 in addition to or instead of the values shown and described herein.

Figure 3:
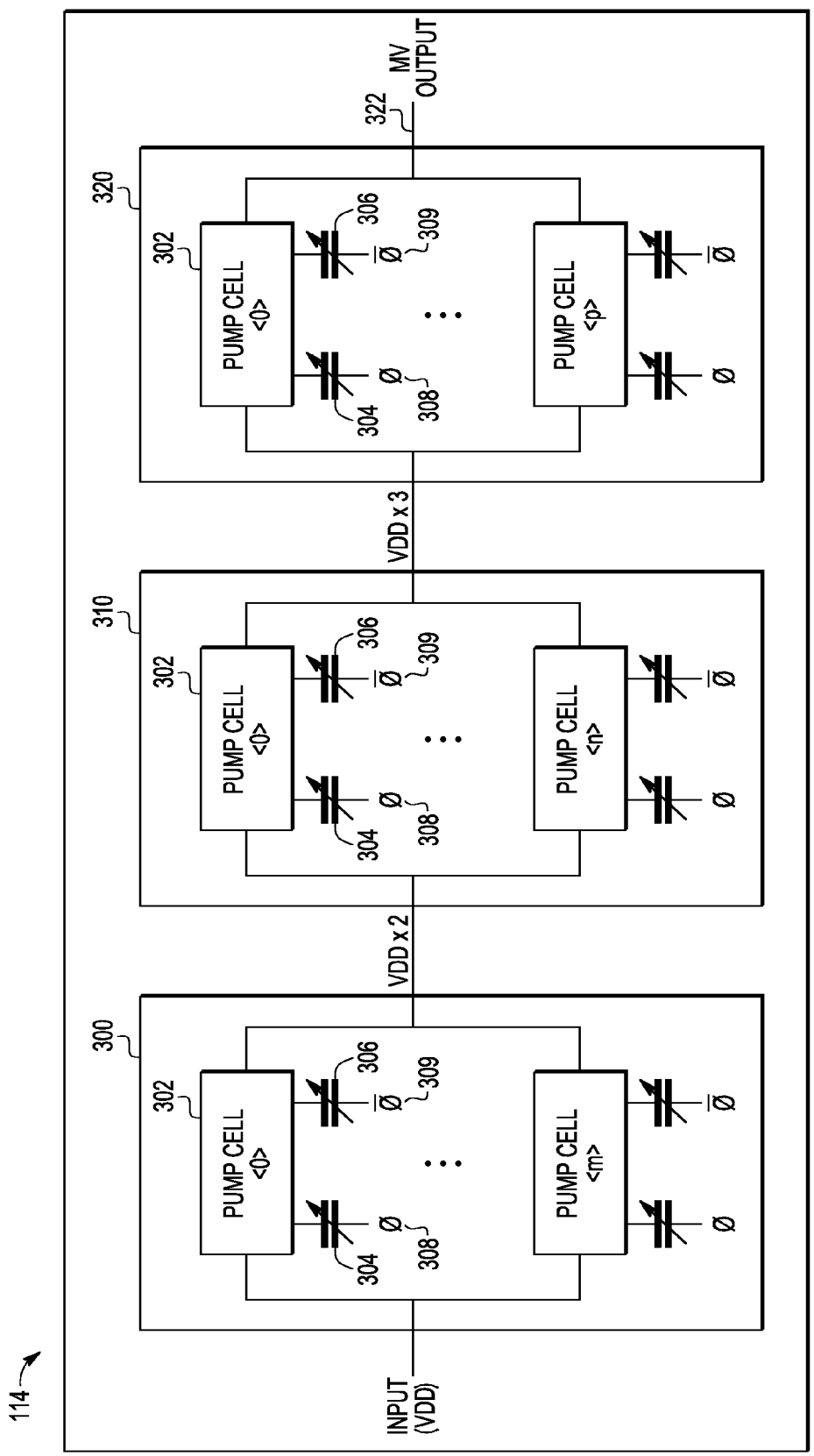
FIG. 3 is a block diagram of an embodiment of a medium voltage charge pump that can be used in the processing system of FIG. 1.

Analog generation unit 108 can further include medium voltage charge pump 114. Referring to FIG. 3, a block diagram of an embodiment of a medium voltage charge pump 114 that can be used in the processing system 100 of FIG. 1 is shown including charge pump stages 300, 310, 320, with each stage including a number of pump cells 302. For example, stage 300 is shown with 0:m pump cells 302, stage 310 is shown with 0:n pump cells 302, and stage 320 is shown with 0:p pump cells 302. An input to stage 300 is a first voltage Vdd. An input to stage 310 is a second voltage Vdd times 2, and an input to stage 320 is a third voltage Vdd times 3. The output of stage 320 is medium voltage signal 322.

A program pulse profile can comprise one or more program voltage pulses. A number of program pulse profiles may be required to completely program all the desired bitcells. The number of pump cells 302 that are enabled in each stage 300, 310, 320 is based on the number of bitcells that need to be programmed by a particular program voltage pulse. The pump cells 302 that are not required to provide the desired program voltage may be disabled for the particular program voltage pulse, and re-enabled if needed during a subsequent program voltage pulse. The medium voltage signal 322 can be further regulated using additional forms of voltage regulation, such as comparator-base regulation, phase shifting of clocks, and/or regulating the input voltage Vdd.

Pump cells 302 can include a first variable or programmable capacitor 304 between clock input 308 and pump cell 302, and a second variable or programmable capacitor 306 between inverse clock input 309 and pump cell 302. The values of variable capacitors 304, 306 are selected based on the current per bit value (as stored, for example, in configuration register 202 of FIG. 2). The clock input 308 to capacitor 304 varies from Vdd to 0 Volts, while the clock input 309 to capacitor 306 varies from 0 to Vdd volts.

Note that by adjusting the number of pump cells 302 in each stage 300, 310, 320 based on the number of bitcells to be programmed, the strength of the medium charge pump 114 can be adjusted before medium charge pump 114 is operated for each program voltage pulse.

Figure 4:
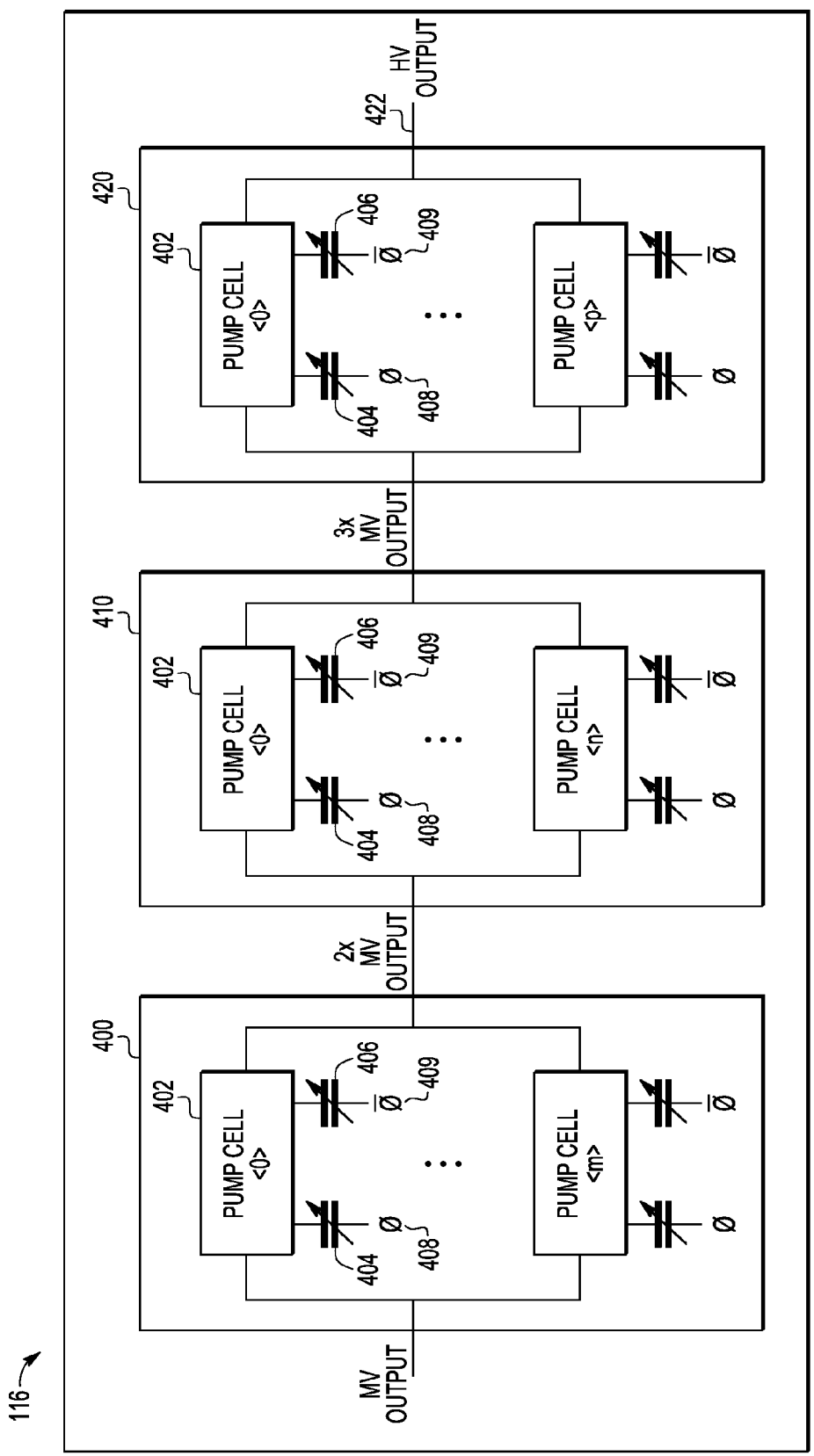
FIG. 4 is a block diagram of an embodiment of a high voltage charge pump that can be used in the processing system of FIG. 1.

Analog generation unit 108 can further include high voltage charge pump 116. Referring to FIG. 4, a block diagram of an embodiment of a high voltage charge pump 116 that can be used in the processing system 100 of FIG. 1 is shown including charge pump stages 400, 410, 420, with each stage including a number of pump cells 402. For example, stage 400 is shown with 0:m pump cells 402, stage 410 is shown with 0:n pump cells 402, and stage 420 is shown with 0:p pump cells 402. An input to stage 400 is the medium voltage output signal 322 of medium voltage charge pump 114 (FIG. 3). An input to stage 410 is medium voltage output signal 322 times 2, and an input to stage 420 is medium voltage output signal 322 times 3. The output of stage 420 is high voltage signal 422.

A program pulse profile can comprise one or more program voltage pulses. A number of program pulse profiles may be required to completely program all the desired bitcells. The number of pump cells 402 that are enabled in each stage 400, 410, 420 is based on the number of bitcells that need to be programmed by a particular program voltage pulse. The pump cells 402 that are not required to provide the desired program voltage may be disabled for the particular program voltage pulse, and re-enabled if needed during a subsequent program voltage pulse. The medium voltage signal 422 can be further regulated using additional forms of voltage regulation, such as comparator-base regulation, phase shifting of clocks, and/or regulating the input voltage, such as the medium voltage output signal or Vdd (for a dedicated high voltage pump).

Pump cells 402 can include a first variable capacitor 404 between clock input 408 and pump cell 402, and a second variable capacitor 406 between inverse clock input 409 and pump cell 402. The values of variable capacitors 404, 406 are selected based on the current per bit value (as stored, for example, in configuration register 202 of FIG. 2). The clock input 408 to capacitor 404 varies from the medium voltage output signal to 0 Volts, while the clock input 409 to capacitor 406 varies from 0 to the medium voltage output signal.

Note that by adjusting the number of pump cells 402 in each stage 400, 410, 420 based on the number of bitcells to be programmed, the strength of the high charge pump 116 can be adjusted before high charge pump 116 is operated for each program voltage pulse.

Figure 5:
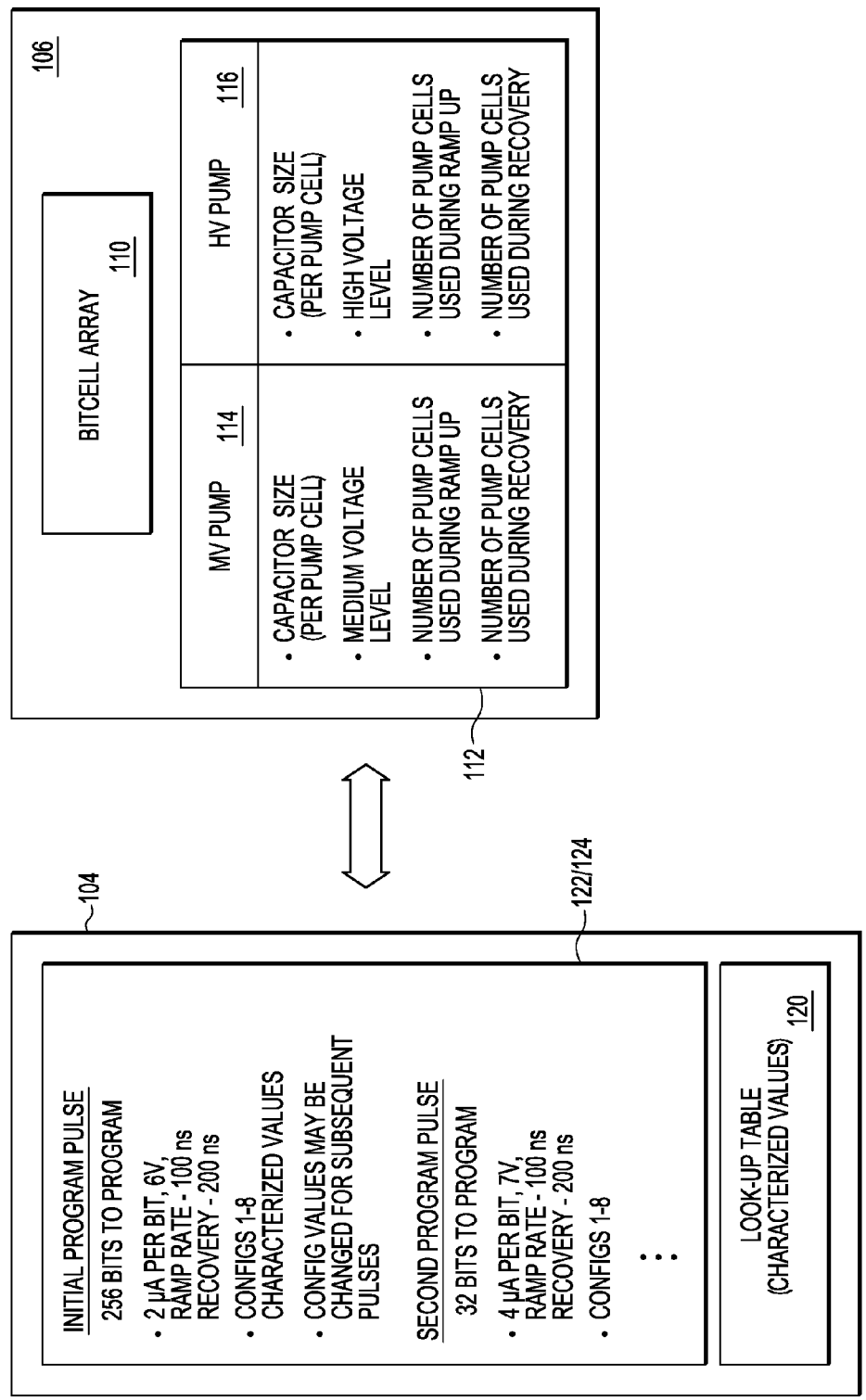
FIG. 5 is a block diagram of an embodiment of a NVM memory unit and a hard block that can be used in the analog generation unit of FIG. 2 showing an example of parameters used to implement a program pulse profile.

FIG. 5 is a block diagram of an embodiment of a NVM memory unit and a hard block that can be used in the analog generation unit of FIG. 2 that shows an example of parameters used to implement a program pulse profile. In the example shown, parameters for an initial pulse by medium voltage charge pump 114 to program 256 bitcells include 2 microAmps per bitcell at 6 Volts, a ramp rate of 100 nanoseconds, and a recovery rate of 200 nanoseconds. After the initial pulse, a program verify process determines that 32 of the 256 bitcells remain unprogrammed. Accordingly, another program pulse at higher current and voltage levels is required. Parameters for a second pulse by medium voltage charge pump 114 to program 32 bitcells include 4 microAmps per bitcell at 7 Volts, a ramp rate of 100 nanoseconds, and a recovery rate of 200 nanoseconds. Additional parameters are provided for high voltage charge pump 116.

The current, voltage, ramp rate, and recovery rate to be used to program the specified number of bits can be derived using table lookup(s) 120, formula(s), or other suitable technique(s).

Accumulator register 122 and/or information row 124 can be used to store values for one or more program pulses. Each set of pulse parameters is provided to configuration registers 202-208 for medium voltage charge pump 114, or configuration registers 210-216 for high voltage charge pump 116 in hardblock 106 before the charge pumps 114, 116 are operated for each program pulse. The information in registers 202-216 is used to determine configuration parameters for charge pumps 114, 116 such as the size (value) of variable capacitors for each pump cell, the input voltage level (Vdd) to the charge pumps 114, 116, the number of pump cells to be used in charge pumps 114, 116 during ramp up, and the number of pump cells to be used in charge pumps 114, 116 during recovery. The charge pump configuration parameters can be determined using calibration and trim data for the charge pumps 114, 116 along with the pulse information in configuration registers 202-216.

Figure 6:
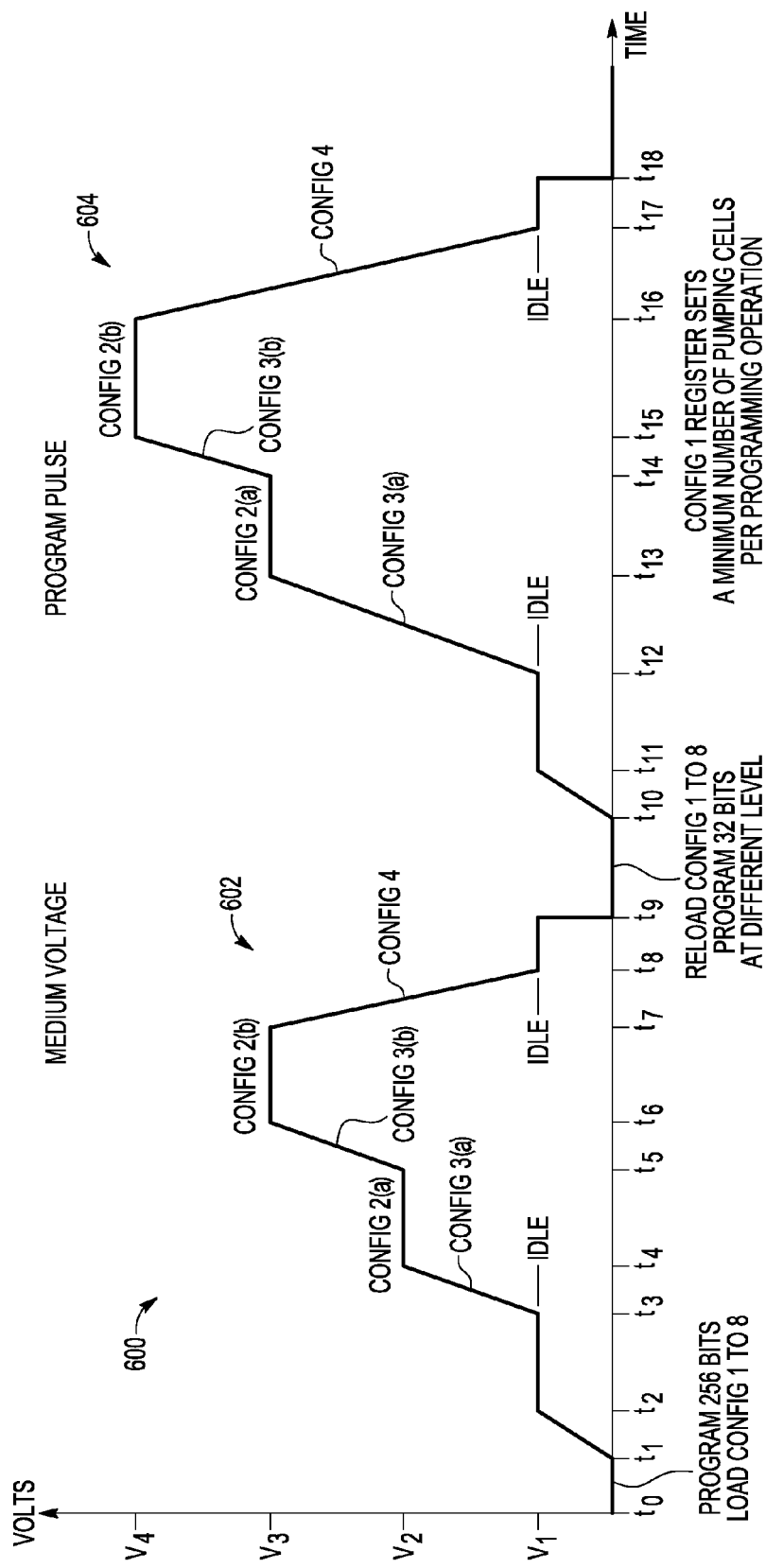
FIG. 6 is a time history diagram of examples of medium voltage program pulse profiles that can be used in the processing system of FIG. 1.

Referring to FIGS. 2 and 6, FIG. 6 is a time history diagram 600 of examples of medium voltage program pulse profiles or programming cycles 602, 604 that can be used in the processing system of FIG. 1. Between time t1 and t2, voltage ramps from zero to an idle state at V1 Volts and remains at V1 Volts until time t3. The ramp rate to the idle state can be a default value. Between time t3 and t4, voltage ramps from V1 to V2 at a ramp rate based on the value in a first segment (config 3(a)) of configuration register 206. The value of voltage V2 is based on the value in a first segment (config 2(a)) of configuration register 204 and is applied for a predetermined time period between time t4 and t5. Between time t5 and t6, voltage ramps from V2 to V3 at a ramp rate based on the value in a second segment (config 3(b)) of configuration register 206. The value of voltage V3 is based on the value in a second segment (config 2(b)) of configuration register 204 and is applied for a predetermined time period between time t6 and t7. Between time t7 and t8, the charge pump performs a recovery operation in which voltage drops from V3 to V1 Volts back to the idle state. The rate of recovery is based on the value in configuration register 208. The charge pump remains in the idle state for a time period between time t8 and t9 before turning off voltage output (i.e., zero voltage at V0).

Between time t9 and t10, configuration registers 202-216 can be re-loaded with updated values to implement pulse profile 604 based on the number of bitcells remaining to programmed. In the example of subsequent pulse profile 604 shown, between time t10 and t11, voltage ramps from zero to an idle state at V1 Volts and remains at V1 Volts until time t12. The ramp rate to the idle state can be a default value. Between time t12 and t13, voltage ramps from V1 to V3 at a ramp rate based on an updated value in a first segment (config 3(a)) of configuration register 206. The value of voltage V3 is based on the updated value in a first segment (config 2(a)) of configuration register 204 and is applied for a predetermined time period between time t13 and t14. Between time t14 and t15, voltage ramps from V3 to V4 at a ramp rate based on the updated value in a second segment (config 3(b)) of configuration register 206. The value of voltage V4 is based on the updated value in a second segment (config 2(b)) of configuration register 204 and is applied for a predetermined time period between time t15 and t16. Between time t16 and t17, the charge pump performs a recovery operation in which voltage drops from V4 to V1 Volts back to the idle state. The rate of recovery is based on the updated value in configuration register 208. The charge pump remains in the idle state for a time period between time t17 and t18 before turning off voltage output (i.e., zero voltage at V0).

Note that although FIG. 6 only shows profiles 602, 604 for medium voltage charge pump 114, additional profiles for high voltage charge pump 116 can also be generated and applied to the bitcells. Additionally, some of the parameters may remain the same between pulse profiles, depending the number of bitcells that remain unprogrammed.

Figure 7:
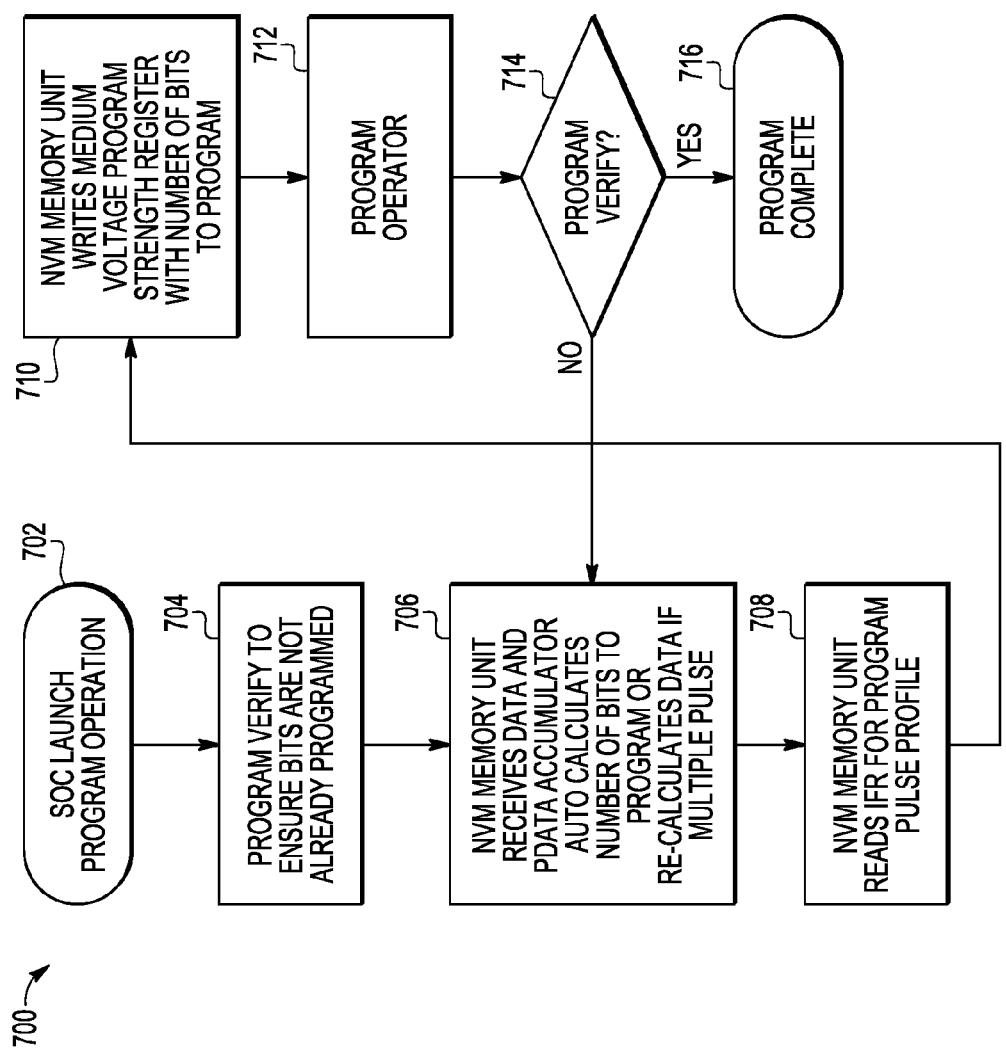
FIG. 7 is a flow diagram of an embodiment of a method for dynamically configuring the number of charge pump cells to be used during each programming cycle of the hard block.

FIG. 7 is a flow diagram of an embodiment of a method 700 for dynamically configuring the number of charge pump cells to be used during each programming cycle of the hard block. Process 702 can include launching a NVM program operation by a computer processor, such as a system on a chip (SOC). Process 704 can include performing a program verify operation to ensure that the bitcells in the NVM array are not already programmed, i.e., that the bitcells have been completely erased. If the bitcells have been erased, process 706 can include the NVM memory unit receiving the data and corresponding addresses to be programmed from the SOC. The data and corresponding addresses can be temporarily stored in an accumulator register in the NVM memory unit.

When the program process is initially started, all of the bitcells required to store the received data will need to be programmed. Process 708 can include reading an information row or table for program pulse information. For example, based on the number of bits to be written, process 708 can access the information row or table to determine a profile of a pulse to program the bitcells. On the initial program pulse, a maximum nominal program voltage value can be used. If all of the required bitcells are not programmed by the program pulse profile, one or more subsequent program pulse profiles can be applied at voltage(s) that are increasingly higher than the program voltages used for the previous program pulse profiles. Thus, process 708 can determine the number of intermediate voltage pulses in the profile, the ramp rate of each voltage pulse, the amount of current required per bitcell, the level of each voltage pulse in the profile, the duration or width of each voltage pulse in the profile, and the recovery rate of the pulse profile.

Once a program pulse profile is determined in process 708, process 710 can include the NVM memory unit providing the number of bitcells to program, the data and addresses to be programmed, and the program pulse profile to the memory hardblock that includes the bitcell memory array and an analog generation unit. The analog generation unit includes medium and high voltage charge pumps along with configuration registers that store information for the program pulse profile to be used to program the remaining bitcells. The configuration of charge pump cells that are enabled or disabled in the charge medium and high voltage charge pumps is based on the program pulse profile stored in the configuration registers.

Process 712 includes performing the program operation during which the program voltages are applied to the bitcells to be programmed.

Process 714 includes performing a program verification operation to determine whether all desired bitcells were programmed during the program operation. If some of the bitcells remain unprogrammed, process 714 transitions to process 706 to determine the number of bitcells that still need to be programmed. Processes 706-714 are repeated until all desired bitcells are programmed. Once the program verify process 714 determines that all bitcells are programmed, control transitions to process 716 in which the program process is considered complete.

By now it should be appreciated that in some embodiments, there can have been provided a semiconductor memory device comprising a non-volatile memory 110, a memory controller 104 for establishing first parameters for a first programming cycle of a first plurality of memory cells 110 of the non-volatile memory 110 prior to the first programming cycle being performed, and a charge pump system 108 that can comprise a plurality of charge pumps 114, 116 and provides a first programming pulse 602 for use in performing the first program cycle. The first programming pulse 602 can be provided by selecting, according to the first parameters, which of the plurality of charge pumps 114, 116 can be enabled during the first program cycle and which can be disabled during the first program cycle.

In other aspects, the charge pump system 108 can comprise a status register 112, coupled to the memory controller 104, that stores parameters for programming pulses, including the first parameters for the first programming pulse 602.

In still other aspects, a plurality of variable capacitors 304, 306, 404, 406 can be included in the plurality of charge pumps 114, 116 and the charge pump system 108 programs the plurality of capacitors according to the first parameters to provide the first programming pulse 602.

In further aspects, the first programming pulse 602 can have a first phase (config 2a) in which a first set of the plurality of charge pumps 114, 116 can be enabled and a second phase (config 2b) in which a second set of the plurality of charge pumps 114, 116 can be enabled.

In further aspects, the first programming phase can have a third phase (config 3a) prior to the first phase (config 2a) in which the variable capacitors 304, 306, 404, 406 can be in a first configuration and a fourth phase (config 3b) after the first phase (config 2a) in which the variable capacitors 304, 306, 404, 406 can be in a second configuration different from the first configuration.

In further aspects, the memory controller 104 establishes second parameters for a second programming cycle for memory cells 110 unsuccessfully programmed during the first programming cycle. The charge pump provides a second programming pulse 604 for the second programming cycle. The second programming pulse 604 can be provided by selecting, according to the second parameters, which of the plurality of charge pumps 114, 116 can be disabled during the second program cycle.

In other aspects, the charge pump system 108 can comprise a status register 112, coupled to the memory controller 104, that stores parameters for programming pulses, including the first parameters for the first programming cycle and the second parameters for the second programming cycle.

In still other aspects, a plurality of variable capacitors 304, 306, 404, 406 can be included in the plurality of charge pumps 114, 116 and the charge pump system 108 programs the plurality of capacitors according to the first parameters to provide the first programming pulse 602 and according to the second parameters to provide the second programming pulse 604.

In still other aspects, the first programming pulse 602 can have a first phase (config 2a) in which a first set of the plurality of charge pumps 114, 116 can be enabled and a second phase (config 2b) in which a second set of the plurality of charge pumps 114, 116 can be enabled and the second programming pulse 604 can have a first phase (config 2a) in which a third set of the plurality of charge pumps 114, 116 can be enabled and a second phase (config 2b) in a fourth set of the plurality of charge pumps 114, 116 can be enabled.

In still other aspects, the parameters comprise current per bit, voltage level, ramp rate, and recovery rate.

In other embodiments, a method of programming selected ones of a plurality of non-volatile memory 110 cells, can comprise identifying first parameters for forming a first programming pulse 602 for a first programming cycle, and applying the first programming pulse 602 to the selected ones of the plurality of non-volatile memory 110 cells from a charge pump system 108 configured responsive to the first parameters.

In other aspects of the method, the applying the programming pulse can include applying the first programming pulse 602 in a plurality of phases according to the parameters by altering the charge pump system 108 during the applying the programming pulse to achieve the plurality of phases.

In still other aspects, the altering the charge pump system 108 can include altering which of a plurality of charge pumps 114, 116 that comprise the charge pump system 108 can be enabled and which can be disabled.

In still other aspects, the altering the charge pump system 108 can include selecting capacitances of programmable capacitances that comprise the charge pump system 108.

In still other aspects, the identifying the first parameters can comprise identifying a first magnitude of current per bit, a first magnitude of voltage level, and a first magnitude of ramp rate.

In still other aspects, identifying which of the selected ones were not successfully programmed by the applying the first programming pulse 602 as unprogrammed bitcells, identifying second parameters for a second programming pulse 604, applying the second programming pulse 604 to the unprogrammed bitcells from the charge pump system 108 by configuring the charge pump system 108 according to the second parameters.

In still other aspects, the configuring the charge pump can comprise the configuring the charge pump system 108 can include selecting, according to the second parameters, which of a plurality of charge pumps 114, 116 that comprise the charge pump system 108 can be enabled and which can be disabled.

In still other aspects, the identifying the second parameters results in different charge pumps being enabled during the second programming pulse 604 than during the first programming pulse 602.

In still other embodiments, a semiconductor memory device can comprise: a non-volatile memory 110, a memory controller 104 for establishing first parameters for a first programming cycle of a first plurality of memory cells 110 of the non-volatile memory 110 prior to the first programming cycle being performed and second parameters for a second programming cycle of a subset of the first plurality of memory cells 110 that were unsuccessfully programmed during the first programming cycle, and a charge pump system 108 that can be configured by the first parameters to provide a first programming pulse 602 for use in performing the first program cycle and configured by the second parameters to provide a second programming pulse 604 for use in performing the second programming cycle.

In still other aspects of the memory device, the charge pump system 108 can comprise a plurality of charge pumps 114, 116 which can be selectively enabled according to the first parameters during the first programming pulse 602 and according to the second parameters during the second programming pulse 604.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, processing system 100 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, tablets, personal digital assistants, electronic games, automotive and other embedded systems, cell phones, and various other wireless devices. A typical computer system includes at least one processing unit, associated memory and a number of input/output (I/O) devices.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   a non-volatile memory;
   a memory controller for establishing first parameters for a first programming cycle of a first plurality of memory cells of the non-volatile memory prior to the first programming cycle being performed;
   a charge pump system that comprises a plurality of charge pumps and provides a first programming pulse for use in performing the first program cycle, wherein the first programming pulse is provided by selecting, according to the first parameters, which of the plurality of charge pumps are to be enabled during the first program cycle and which are to be disabled during the first program cycle; and
   the memory controller establishes second parameters for a second programming cycle for memory cells unsuccessfully programmed during the first programming cycle, the charge pump provides a second programming pulse for the second programming cycle, the second programming pulse is provided by selecting, according to the second parameters, which of the plurality of charge pumps are to be disabled during the second program cycle.

2. The semiconductor device of claim 1 wherein the charge pump system comprises:

a status register, coupled to the memory controller, that stores parameters for programming pulses, including the first parameters for the first programming pulse.

3. The semiconductor device of claim 2, wherein a plurality of variable capacitors are included in the plurality of charge pumps and the charge pump system programs the plurality of variable capacitors according to the first parameters to provide the first programming pulse.

4. The semiconductor device of claim 1, wherein the first programming pulse has a first phase in which a first set of the plurality of charge pumps are enabled and a second phase in which a second set of the plurality of charge pumps are enabled.

5. The semiconductor device of claim 4, wherein the first programming pulse has a third phase prior to the first phase in which variable capacitors are in a first configuration and a fourth phase after the first phase in which the variable capacitors are in a second configuration different from the first configuration.

6. The semiconductor device of claim 1, wherein the charge pump system comprises: a status register, coupled to the memory controller, that stores parameters for programming pulses, including the first parameters for the first programming cycle and the second parameters for the second programming cycle.

7. The semiconductor device of claim 6, wherein a plurality of variable capacitors are included in the plurality of charge pumps and the charge pump system programs the plurality of capacitors according to the first parameters to provide the first programming pulse and according to the second parameters to provide the second programming pulse.

8. The semiconductor device of claim 7, wherein the first programming pulse has a first phase in which a first set of the plurality of charge pumps are enabled and a second phase in which a second set of the plurality of charge pumps are enabled and the second programming pulse has a first phase in which a third set of the plurality of charge pumps are enabled and a second phase in a fourth set of the plurality of charge pumps are enabled.

9. The semiconductor device of claim 1, wherein the parameters comprise current per bit, voltage level, ramp rate, and recovery rate.

10. A method of programming selected ones of a plurality of non-volatile memory cells, comprising:
identifying first parameters for forming a first programming pulse for a first programming cycle, wherein the identifying the first parameters comprises identifying a first magnitude of current per bit, a first magnitude of voltage level, and a first magnitude of ramp rate;
applying the first programming pulse to the selected ones of the plurality of non-volatile memory cells from a charge pump system configured responsive to the first parameters.

11. The method of claim 10, wherein the applying the programming pulse includes applying the first programming pulse in a plurality of phases according to the first parameters by altering the charge pump system during the applying the first programming pulse to achieve the plurality of phases.

12. The method of claim 11, wherein the altering the charge pump system includes altering which of a plurality of charge pumps that comprise the charge pump system are enabled and which are disabled.

13. The method of claim 12, wherein the altering the charge pump system includes selecting capacitances of programmable capacitances that comprise the charge pump system.

14. The method of claim 13, further comprising:
identifying which of the selected ones were not successfully programmed by the applying the first programming pulse as unprogrammed bitcells,
identifying second parameters for a second programming pulse,
applying the second programming pulse to the unprogrammed bitcells from the charge pump system by configuring the charge pump system according to the second parameters.

15. The method of claim 14, wherein the configuring the charge pump comprises:
the configuring the charge pump system includes selecting, according to the second parameters, which of a plurality of charge pumps that comprise the charge pump system are enabled and which are disabled.

16. The method of claim 15, wherein the identifying the second parameters results in different charge pumps being enabled during the second programming pulse than during the first programming pulse.

17. A processing system comprising:
a system-on-a-chip computer processing device;
a non-volatile memory;
a memory controller coupled between the computer processing device and the non-volatile memory for establishing first parameters for a first programming cycle of a first plurality of memory cells of the non-volatile memory prior to the first programming cycle being performed and second parameters for a second programming cycle of a subset of the first plurality of memory cells that were unsuccessfully programmed during the first programming cycle; and
a charge pump system that is configured by the first parameters to provide a first programming pulse for use in performing the first program cycle and configured by the second parameters to provide a second programming pulse for use in performing the second programming cycle, wherein the charge pump system comprises a plurality of charge pumps which are selectively disabled according to the first parameters during the first programming pulse and according to the second parameters during the second programming pulse.

* * * * *